United States Patent
Siebert

(10) Patent No.: US 7,895,486 B2
(45) Date of Patent: Feb. 22, 2011

(54) SEMICONDUCTOR DEVICE TEST SYSTEM WITH TEST INTERFACE MEANS

(75) Inventor: Harry Siebert, Puchheim (DE)

(73) Assignee: Infineon Technologies AG, Neubiberg (DE)

( * ) Notice: Subject to any disclaimer, the term of this patent is extended or adjusted under 35 U.S.C. 154(b) by 437 days.

(21) Appl. No.: 11/513,964

(22) Filed: Aug. 31, 2006

(65) Prior Publication Data

US 2007/0061639 A1    Mar. 15, 2007

(30) Foreign Application Priority Data

Sep. 1, 2005    (DE) .................. 10 2005 041 614

(51) Int. Cl.
*G01R 31/28* (2006.01)

(52) U.S. Cl. ..................... 714/726; 324/763
(58) Field of Classification Search ......... 714/725–727, 714/742
See application file for complete search history.

(56) References Cited

U.S. PATENT DOCUMENTS

| | | | |
|---|---|---|---|
| 5,636,227 A | 6/1997 | Segars | |
| 5,708,773 A * | 1/1998 | Jeppesen, III et al. | ......... 714/30 |
| 6,158,032 A | 12/2000 | Currier et al. | |
| 6,425,101 B1 | 7/2002 | Garreau | |
| 6,757,844 B1 * | 6/2004 | Lulla et al. | ..................... 714/30 |
| 6,925,583 B1 * | 8/2005 | Khu et al. | ..................... 714/30 |
| 2003/0046625 A1 * | 3/2003 | Menon et al. | ............... 714/727 |

FOREIGN PATENT DOCUMENTS

| | | |
|---|---|---|
| DE | 19943941 | 5/2000 |
| EP | 0 826 974 A2 | 3/1998 |

OTHER PUBLICATIONS

IEEE Std 1149.1-1990. IEEE Standard Test Access Port and Boundary-Scan Architecture.*

* cited by examiner

*Primary Examiner*—Jeffrey A Gaffin
*Assistant Examiner*—Steve Nguyen
(74) *Attorney, Agent, or Firm*—Dicke, Billig & Czaja, PLLC

(57) ABSTRACT

A semiconductor device test system has an interface for use with a semiconductor device test method, and a semiconductor device test method. In a first mode of an interface, in reaction to test signals corresponding to a test standard, for example, a JTAG test standard, and received by the interface from a test device, the interface outputs signals corresponding to the test standard to a semiconductor device to be tested. In a second mode of the interface, in reaction to test signals corresponding to the test standard and received by the interface from a test device, the interface outputs signals that do not correspond to the test standard to a semiconductor device to be tested.

17 Claims, 2 Drawing Sheets

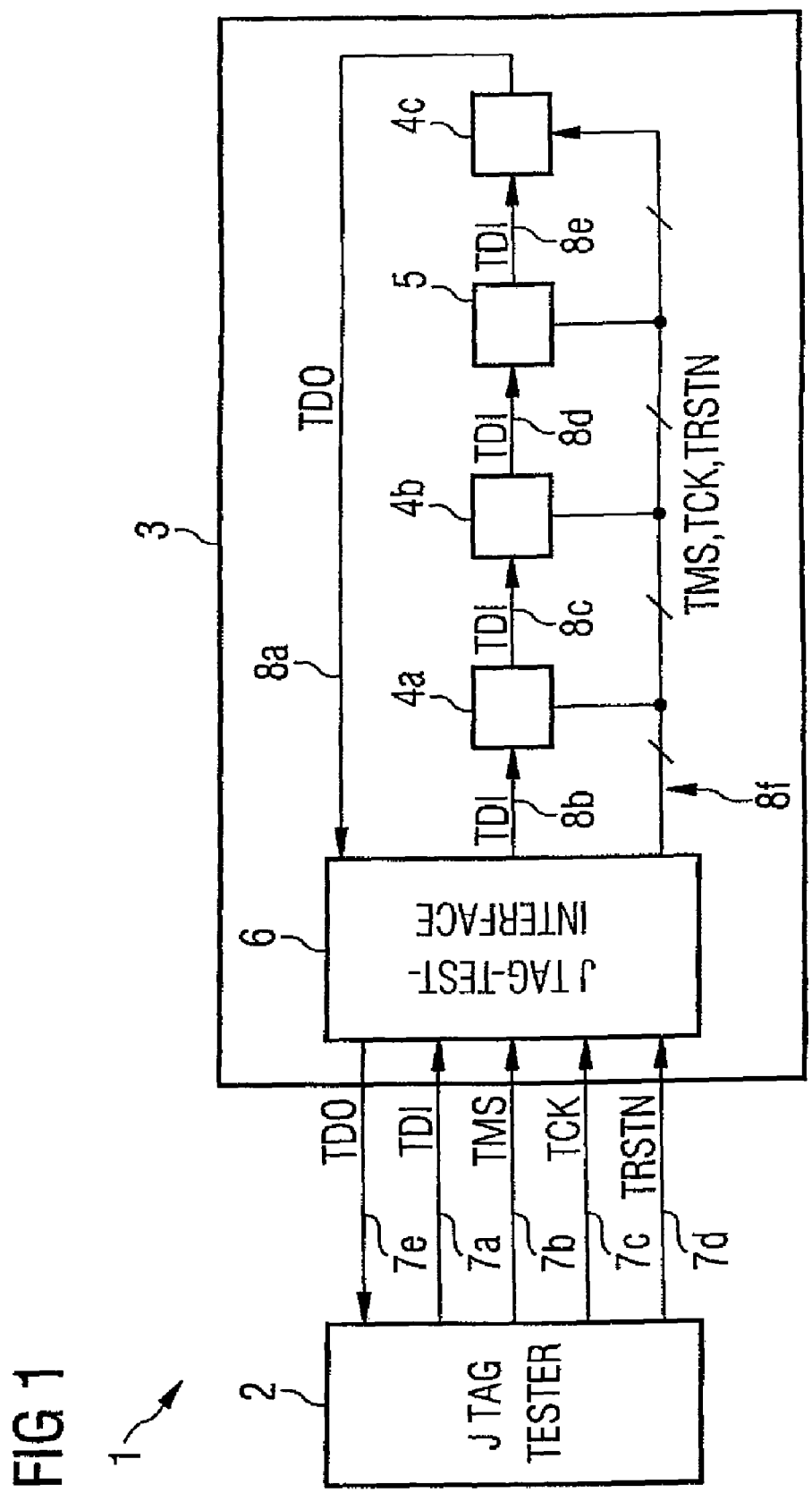

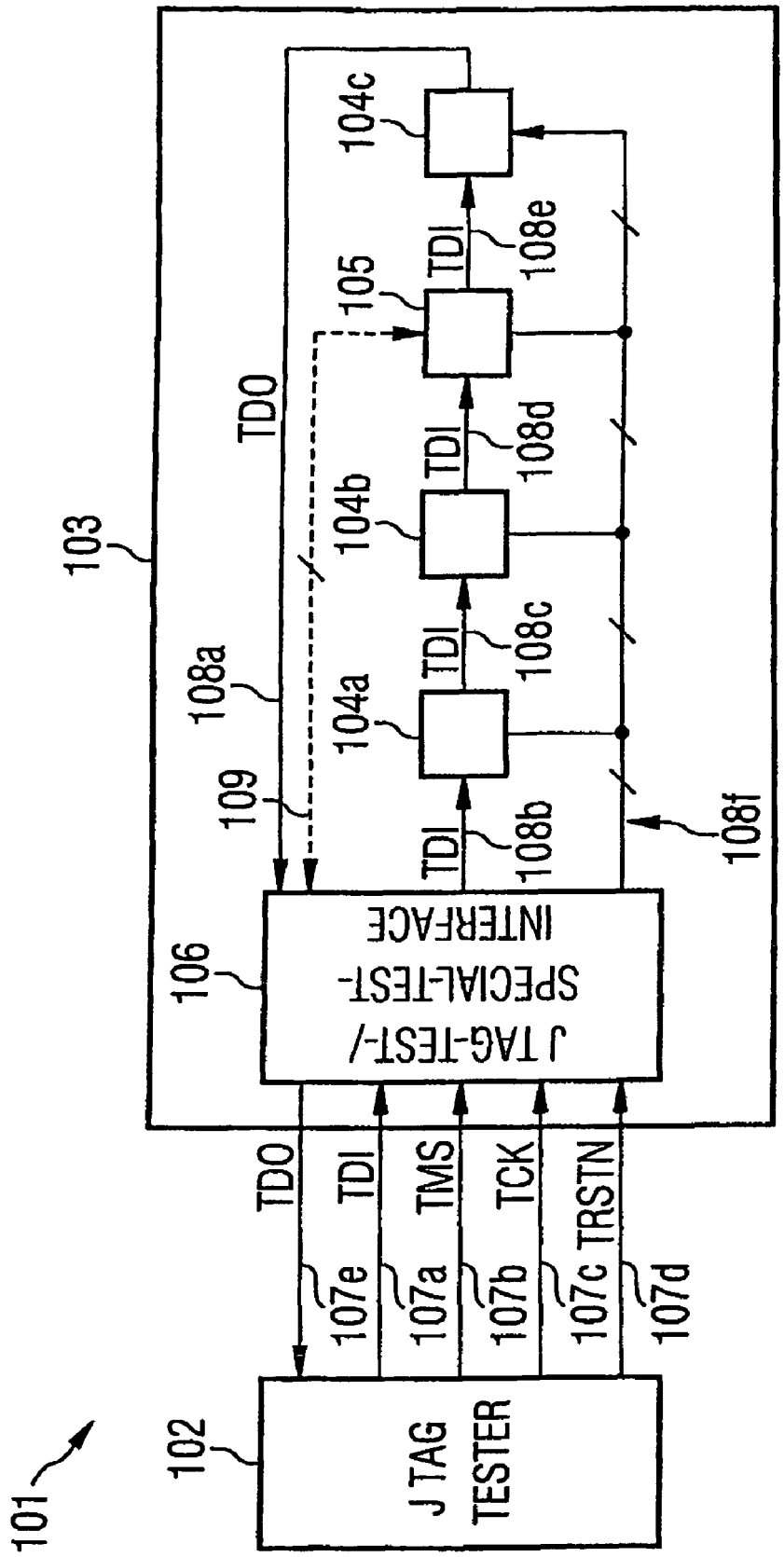

SEMICONDUCTOR DEVICE TEST SYSTEM WITH TEST INTERFACE MEANS

CROSS-REFERENCE TO RELATED APPLICATIONS

This Utility Patent Application claims priority to German Patent Application No. DE 10 2005 041 614.4, filed on Sep. 1, 2005 which is incorporated herein by reference.

BACKGROUND

The invention relates to a semiconductor device test system, a semiconductor device test method, and an interface device for use with such a test method.

Semiconductor devices, e.g. corresponding, integrated (analog or digital) computing circuits, e.g. corresponding micro processors or micro controllers, and/or semiconductor memory devices such as functional memory devices (PLAs, PALs, etc.) and table memory devices (e.g. ROMs or RAMs, in particular SRAMs and DRAMs), etc. are subject to comprehensive tests during and after their manufacturing.

Thus, it is possible to identify and sort out (or repair) defective semiconductor devices or modules; alternatively or additionally—in correspondence with the test results achieved—the layout of the semiconductor devices can be modified, and/or the process parameters used during the manufacturing of the devices may be correspondingly modified or adjusted optimally, respectively, and/or the software program stored on the semiconductor device may be modified.

For carrying out—correspondingly standardized—test methods, a JTAG test module (JTAG=Joint Test Action Group) defined in IEEE standard 1149 may be used.

In accordance with the above-mentioned standard, a JTAG test module—provided on a corresponding semiconductor device—includes a test access port (TAP) that is connected with four or—optionally—five test pins by means of which a test clock signal TCK (TCK=Test Clock), a test mode select signal TMS (TMS=Test Mode Select), a data input signal TDI (TDI=Test Data In), a data output signal TDO (TDO=Test Data Out), and—optionally—a test reset signal TRST (TRST=Test Reset) can be input into/output from the device to be tested.

Semiconductor devices that include corresponding JTAG test modules may—pursuant to the original JTAG standard—, after their incorporation in an electronic system, in particular after soldering with a corresponding printed circuit board, be tested for whether there exists a sufficiently good electrical contact between the semiconductor device pins and the pins of the printed circuit board.

In accordance with recent revisions of the JTAG standard, e.g. corresponding semiconductor device function tests that concern the actual function of the semiconductor device may be performed by a JTAG test module in addition thereto, e.g. corresponding JTAG built-in self tests, and/or a corresponding programming of the device may be performed by means of the JTAG test module, and/or a downloading of memory contents.

Furthermore, a plurality of proprietary, manufacturer-specific, non-standardized test methods are known in prior art, which are in particular used e.g. for testing the devices prior to their incorporation in an electronic system, for instance, for testing semiconductor devices that are still positioned on a corresponding wafer, for testing the semiconductor devices that are available individually after the sawing apart (or the scratching, and breaking) of the wafer, and/or for testing the semiconductor devices incorporated in a corresponding device package.

In so doing, one has been trying to keep the number of pads or pins that are necessary for such tests relatively small.

In the case of so-called SSCM tests (SSCM="Single Scan Chain Mode"), for instance, by means of only few, e.g. two additional pins, a scan test of the elements provided on a semiconductor device, in particular of memory elements, e.g. flip-flops, can be carried out. Here, e.g. a first additional pin serves for the input of test data, and a further additional pin for the output of test data (wherein the data to be output may, for instance, be stored in a corresponding shift register).

Such proprietary, manufacturer-specific tests can no longer, or only with relatively great effort, be carried out after the incorporation of the corresponding semiconductor device in an electronic system, in particular after the soldering of the semiconductor device with a corresponding printed circuit board—along with further semiconductor devices of different manufacturers.

SUMMARY

One aspect of the invention provides a novel semiconductor device test system, a novel semiconductor device test method, and novel interface means for use with such a test method.

In accordance with one aspect of the invention there is provided a semiconductor device test method, wherein i) in a first mode of an interface device, in reaction to test signals (TCK, TMS, TDI, TRSTIN) corresponding to a test standard and received by the interface device, the interface device outputs signals corresponding to the test standard to a semiconductor device to be tested, and wherein, ii) in a second mode of the interface device, in reaction to test signals (TCK, TMS, TDI, TRSTN) corresponding to the test standard and received by the interface device, the interface device outputs signals that do not correspond to the test standard to a semiconductor device to be tested.

The interface device may be incorporated in one and the same electronic system as the semiconductor device to be tested.

With one embodiment of the invention it may be achieved—without major effort—that corresponding proprietary, not standard-compliant, manufacturer-specific tests can be carried out at the semiconductor device even after the incorporation of the corresponding semiconductor device in the electronic system.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 is a schematic representation of a semiconductor device test system with a JTAG test device connected to an electronic system via a JTAG interface, in accordance with prior art.

FIG. 2 is a schematic representation of a semiconductor device test system with a JTAG test device connected to an electronic system, in accordance with an embodiment of the present invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 1 illustrates a schematic representation of a semiconductor device test system 1 in accordance with prior art.

It includes a JTAG test device 2 that is connected to the electronic system 3 via a JTAG interface 6 of an electronic system 3.

The electronic system 3 may, for instance, be a printed circuit board into which a plurality of semiconductor devices 4a, 4b, 4c, 5 are incorporated, e.g. corresponding integrated (analog or digital) computing circuits, e.g. micro processors or micro controllers, and/or semiconductor memory devices such as functional memory devices (PLAs, PALs, etc.) and table memory devices (e.g. ROMs or RAMs, in particular SRAMs and DRAMs).

The semiconductor device 5 may, for instance, stem from a particular, first manufacturer, and one or several further semiconductor devices 4a, 4b, 4c from one or several further manufacturers that differ from the first manufacturer.

For performing—correspondingly standardized—test methods, corresponding JTAG test modules (JTAG=Joint Test Action Group) may be provided on the semiconductor devices 4a, 4b, 4c, 5.

Each JTAG test module includes a test access port (TAP or Test Access Port) that is connected with four or—optionally—five test pins by means of which a test clock signal TCK (TCK=Test Clock), a test mode select signal TMS (TMS=Test Mode Select), a data input signal TDI (TDI=Test Data In), a data output signal TDO (TDO=Test Data Out), and—optionally—a test reset signal TRST (TRST=Test Reset) can be input into/output from the corresponding semiconductor device 4a, 4b, 4c, 5.

The control of the above-mentioned test methods is performed by the above-mentioned JTAG test device 2 which is connected with the JTAG interface 6 of the electronic system 3 via four—or optionally five—test lines or test channels 7a, 7b, 7c, 7d, 7e.

As will be explained in more detail in the following, the semiconductor devices 4a, 4b, 4c, 5 provided on the printed circuit board 9 may form a specific JTAG daisy chain specified in the above-mentioned JTAG standard:

Via a first line 7a, a data input signal TDI (TDI=Test Data In) is sent by the test device 2 to the JTAG interface 6 which forwards the data input signal TDI (TDI=Test Data In) via a test line 8b of the electronic system 3 or the above-mentioned printed circuit board, respectively, to the JTAG data input pin of the first semiconductor device 4a of the semiconductor devices 4a, 4b, 4c, 5 (not, however, to corresponding JTAG data input pins of the remaining semiconductor devices 4b, 4c, 5).

On the other hand, a test mode select signal TMS (TMS=Test Mode Select) sent by the test device 2 to the JTAG interface 6 via a second line 7b, a test clock signal TCK (TCK=Test Clock) sent by the test device 2 to the JTAG interface 6 via a third line 7c, and—optionally—a test reset signal TRST (TRST=Test Reset) sent by the test device 2 to the JTAG interface 6 via a fourth line 7d are, via corresponding test lines 8f of the electronic system 3 or of the above-mentioned printed circuit board, respectively, transmitted to all of the above-mentioned semiconductor devices 4a, 4b, 4c, 5 (more exactly: to corresponding JTAG test mode select pins, JTAG test clock pins, or JTAG test reset pins, respectively, of the above-mentioned semiconductor devices 4a, 4b, 4c, 5).

One respective of the above-mentioned semiconductor devices 4a, 4b, 4c, 5—e.g. the semiconductor device 5—may be in a JTAG test perform mode, and the remaining semiconductor devices—e.g. the semiconductor devices 4a, 4b, 4c—in a JTAG test signal transmit mode ("bypass mode").

Data input signals TDI (TDI=Test Data In) received by the semiconductor devices 4a, 4b, 4c—that are in the above-mentioned bypass mode—at the respective JTAG data input pin are—unmodified, but delayed by one clock—output at the respective JTAG data output pin of the respective semiconductor device 4a, 4b, 4c.

On the other hand, with the semiconductor device 5 that is in the above-mentioned JTAG test perform mode, the corresponding JTAG test is performed by means of the above-mentioned data input signal TDI (TDI=Test Data In) received at the corresponding JTAG data input pin, and the data output signal TDO (TDO=Test Data Out) generated in reaction to the JTAG test—and differing from the input data input signal TDI (TDI=Test Data In)—is output at the corresponding JTAG data output pin of the semiconductor device 5 that is in the above-mentioned JTAG test perform mode.

In other words, for instance, the data input signal TDI (TDI=Test Data In) received by the first semiconductor device 4a that is in the bypass mode via the test line 8b at the JTAG data input pin is output—unmodified, but delayed by one clock—at the JTAG data output pin of the first semiconductor device 4a, and—as is illustrated in FIG. 1—transmitted via a test line 8c to the next semiconductor device in the above-mentioned JTAG daisy chain (here: to the JTAG data input pin of the second semiconductor device 4b).

The data input signal TDI (TDI=Test Data In) received by the second semiconductor device 4b—which is also in the bypass mode—via the test line 8c at the JTAG data input pin thereof is output—unmodified, but delayed by one (further) clock—at the JTAG data output pin of the second semiconductor device 4b and—as is illustrated in FIG. 1—transmitted to the next semiconductor device in the above-mentioned JTAG daisy chain (here: to the JTAG data input pin of the third semiconductor device 5 that is in the JTAG test perform mode) via a test line 8d.

The data output signal TDO (TDO=Test Data Out) generated in reaction to the received data input signal TDI (TDI=Test Data In) and the JTAG test performed in the third semiconductor device 5 and output at the JTAG data output pin thereof is—as is illustrated in FIG. 1—transmitted to the next semiconductor device in the above-mentioned JTAG daisy chain via a test line 8e (here: to the JTAG data input pin of the fourth semiconductor device 4c which is in the bypass mode).

The signal received by the fourth semiconductor device 4c via the test line 8e at the JTAG data input pin thereof is output—unmodified, but delayed by one clock—at the JTAG data output pin of the fourth semiconductor device 4c and—as is illustrated in FIG. 1—transmitted to the above-mentioned JTAG interface 6 via a test line 8a, and from there—as test data output signal TDO (TDO=Test Data Out)—via a test line 7e to the JTAG test device 2.

FIG. 2 illustrates—by way of example—a schematic representation of a semiconductor device test system 101 in accordance with an embodiment of the invention.

It includes a JTAG test device 102, such as an IEEE standard "1149" or IEEE standard "1149.1" JTAG test device 102 which is connected to an electronic system 103 via a specific JTAG test/proprietary test interface device 106 that will be explained in more detail in the following.

The electronic system 103 may, for instance, be a printed circuit board into which or to which a plurality of semiconductor devices 104a, 104b, 104c, 105 that are each differently constructed and/or equipped—illustrated by way of example in FIG. 2—are incorporated or soldered, e.g. corresponding integrated (analog or digital) computing circuits, e.g. micro processors or micro controllers, and/or semiconductor memory devices such as functional memory devices (PLAs, PALs, etc.) and table memory devices (e.g. ROMs or RAMs, in particular SRAMs and DRAMs), etc. (and/or a plurality of further devices that are not illustrated in FIG. 2).

The semiconductor device 105 may, for instance, stem from a particular, first manufacturer, and one or a plurality of further semiconductor devices 104a, 104b, 104c from one or a plurality of further manufacturers differing from the first manufacturer (wherein the semiconductor device 105 may be constructed and/or equipped differently from one or a plurality of further semiconductor devices (104a, 104b, 104c).

For the normal operation of the electronic system 103, the semiconductor devices 104a, 104b, 104c, 105 are—for the exchange of corresponding reference, address, and control data—connected with each other via a plurality of reference, address, and control lines that are provided on the above-mentioned printed circuit board and that are not illustrated in FIG. 2.

For performing—correspondingly standardized, and/or proprietary, manufacturer-specific, non-standardized—test methods, corresponding JTAG test modules (JTAG=Joint Test Action Group)—defined in IEEE standard 1149—(or parts thereof, cf. below) may be provided on the semiconductor devices 104a, 104b, 104c, 105, and/or—in the instant embodiment e.g. on the semiconductor device 5—one or a plurality of proprietary, manufacturer-specific, non-standardized test modules.

Each JTAG test module includes a tests access port (TAP) that is connected with four or—optionally—five test pins by means of which a test clock signal TCK (TCK=Test Clock), a test mode select signal TMS (TMS=Test Mode Select), a data input signal TDI (TDI=Test Data In), a data output signal TDO (TDO=Test Data Out), and—optionally—a test reset signal TRST (TRST=Test Reset) can be input into/output from the corresponding semiconductor device 104a, 104b, 104c, 105.

The control of the above-mentioned test methods is performed by the above-mentioned JTAG test device 102 that is connected with the JTAG test/proprietary test interface device 106 of the electronic system 103 via four—or optionally five—test lines or test channels 107a, 107b, 107c, 107d, 107e. The signals exchanged between the JTAG test/proprietary test interface device 106 and the JTAG test device 102 via the test lines or test channels 107a, 107b, 107c, 107d, 107e correspond—e.g. with respect to data rate/transmission speed, timing, etc.—to the JTAG standard or the signal transmission protocol specified there, respectively.

For performing corresponding test methods, the semiconductor devices 104a, 104b, 104c, 105 provided on the printed circuit board 109 may—as is illustrated in FIG. 2—form a specific JTAG daisy chain specified in JTAG standard.

As results from FIG. 2, the JTAG test/proprietary test interface device 106 is connected between the above-mentioned JTAG daisy chain and the JTAG test device 102.

The JTAG test/proprietary test interface device 106 may, for instance, be designed in the form of a corresponding, separate chip that is soldered to the above-mentioned printed circuit board 103, e.g. in the form of a corresponding CPLD chip (CPLD=Complex Programmable Logic Device) (i.e. may be permanently connected with the printed circuit board 103).

Alternatively, the JTAG test/proprietary test interface device 106, in particular the corresponding CPLD chip, may also be connected detachably with the printed circuit board 103, e.g. by means of a corresponding plug connection.

Alternatively to the configuration illustrated in FIG. 2, a JTAG interface that is, for instance, constructed and/or equipped correspondingly similar or identical to the JTAG interface 6 illustrated in FIG. 1 may be connected between the JTAG test/proprietary test interface device 106 and the JTAG test device 102 (or alternatively e.g. between the JTAG test/proprietary test interface device 106 and the above-mentioned semiconductor devices 104a, 104b, 104c, 105). Alternatively, the function of the JTAG interface 6 illustrated in FIG. 1 may—in addition to the functions that will be explained in more detail in the following—also be fulfilled by the JTAG test/proprietary test interface device 106 itself.

The JTAG test/proprietary test interface device 106 (and thus the electronic system 103 as a whole) may be in two different states:

i) in a "FEED-THROUGH" mode, or
ii) in an "ISOLATE" mode.

The "FEED-THROUGH" mode serves to perform a corresponding, standardized JTAG test, and the "ISOLATE" mode e.g. to perform a manufacturer-specific, non-standardized, proprietary test.

In the above-mentioned "FEED-THROUGH" mode, signals TCK (TCK (TCK=Test Clock), TMS (TMS=Test Mode Select), TDI (TDI=Test Data In), and—optionally—TRST (TRST=Test Reset) that are—as will be explained in more detail in the following—sent by the test device 102 via corresponding test lines 107a, 107b, 107c, 107d to the JTAG test/proprietary test interface device 106, are transmitted by the JTAG test/proprietary test interface device 106—without any or just with a minimal delay, and possibly correspondingly intermediately amplified—to one or a plurality of the above-mentioned semiconductor devices 104a, 104b, 104c, 105.

Vice versa, in the "FEED-THROUGH" mode, a signal TDO (TDO=Test Data Out) that is sent by the last link of the above-mentioned daisy chain, i.e. here: by the semiconductor device 104c, via a line 108a to the JTAG test/proprietary test interface device 106 is transmitted by the JTAG test/proprietary test interface device 106—without any or just with a minimal delay, and possibly correspondingly intermediately amplified—via a test line 107e to the test device 102.

In detail, in the above-mentioned "FEED-THROUGH" mode, a JTAG test data input signal TDI (TDI=Test Data In) that is sent by the test device 102 via a first line 107a to the JTAG test/proprietary test interface device 106, is transmitted by the JTAG test/proprietary test interface device 106—without any or just with a minimal delay, and possibly correspondingly intermediately amplified—via a test line 108*b* of the electronic system 103 or of the above-mentioned printed circuit board, respectively, to the JTAG data input pin of the first semiconductor device 104*a* of the semiconductor devices 104*a*, 104*b*, 104*c*, 105 (i.e. to the first link of the above-mentioned daisy chain, i.e. here: to the semiconductor device 104*a*, not, however, to corresponding JTAG data input pins of the remaining semiconductor devices 104*b*, 104*c*, 105 provided in the above-mentioned daisy chain).

On the other hand, a JTAG test mode select signal TMS (TMS=Test Mode Select) that is sent by the test device 102 via a second line 107*b* to the JTAG test/proprietary test interface device 106, a JTAG test clock signal TCK (TCK=Test Clock) that is sent by the test device 102 via a third line 107*c* to the JTAG test/proprietary test interface device 106, and—optionally—a test reset signal TRST (TRST=Test Reset) that is sent by the test device 102 via a fourth line 107*d* to the JTAG test/proprietary test interface device 106 are—without any or just with a minimal delay, and possibly correspondingly intermediately amplified—transmitted by the JTAG test/proprietary test interface device 106 via corresponding test lines 108*f* of the electronic system 103 or the above-mentioned printed circuit board, respectively, to all the above-mentioned semiconductor devices 104*a*, 104*b*, 104*c*, 105 (more exactly: to corresponding JTAG test mode select pins, JTAG test clock pins, or JTAG test reset pins, respectively, of the above-mentioned semiconductor devices 104*a*, 104*b*, 104*c*, 105).

One respective of the above-mentioned semiconductor devices 104*a*, 104*b*, 104*c*, 105—e.g. the semiconductor device 105—may be in a JTAG test perform mode during the above-mentioned "FEED-THROUGH" mode of the JTAG test/proprietary test interface device 106, and the remaining semiconductor devices—e.g. the semiconductor devices 104*a*, 104*b*, 104*c*—in a JTAG test signal transmit mode ("bypass mode").

To have a corresponding semiconductor device 104*a*, 104*b*, 104*c*, 105 change from the bypass mode to the JTAG test perform mode (or, vice versa, from the JTAG test perform mode to the bypass mode), the test device sends corresponding JTAG control signals to the semiconductor devices 104*a*, 104*b*, 104*c*, 105 (e.g. via the above-mentioned line 107*a*, and/or the above-mentioned line 107*b*).

Data input signals TDI (TDI=Test Data In) received by the semiconductor devices 104*a*, 104*b*, 104*c*—that are in the above-mentioned bypass mode—at the respective JTAG data input pin are—unmodified, but delayed by one clock—output at the respective JTAG data output pin of the respective semiconductor device 104*a*, 104*b*, 104*c*.

On the other hand, in the semiconductor device 105 that is in the above-mentioned JTAG test perform mode, the corresponding JTAG test can be performed by means or by use of the above-mentioned data input signal TDI (TDI=Test Data In) received at the corresponding JTAG data input pin, and the data output signal TDO (Test Data Out) generated in reaction to the JTAG test—and differing from the input data input signal TDI (TDI=Test Data In)—can be output at the corresponding JTAG data output pin of the semiconductor device 105 that is in the above-mentioned JTAG test perform mode. To this end, a JTAG test data register that is connected with the JTAG data output pin may, for instance, be read out, wherein the above-mentioned data output signal TDO (TDO=Test Data Out) may reflect the content of the corresponding JTAG test data register.

In the configuration of the electronic system 103 illustrated by way of example in FIG. 2, the data input signal TDI (TDI=Test Data In) received by the above-mentioned first semiconductor device 104*a* that is in the bypass mode via the test line 108*b* at the JTAG data input pin is output—unmodified, but delayed by one clock—at the JTAG data output pin of the first semiconductor device 104*a* and—as is illustrated in FIG. 2—transmitted via a test line 108*c* to the next semiconductor device in the above-mentioned JTAG daisy chain (here: to the JTAG data input pin of the second semiconductor device 104*b*).

The data input signal TDI (TDI=Test Data In) received by the second semiconductor device 104*b*—that is also in the bypass mode—via the test line 108*c* at the JTAG data input pin is output—unmodified, but delayed by one (further) clock—at the JTAG data output pin of the second semiconductor device 104*b* and—as is illustrated in FIG. 2—transmitted via a test line 108*d* to the next semiconductor device in the above-mentioned JTAG daisy chain (here: to the JTAG data input pin of the third semiconductor device 105 that is in the JTAG test perform mode).

The data output signal TDO (TDO=Test Data Out) generated in reaction to the received data input signal TDI (TDI=Test Data In) and to the JTAG test performed in the third semiconductor device 105, or reflecting the content of the JTAG test data register connected with the JTAG data output pin of the semiconductor device 105, respectively—and output at the JTAG data output pin of the semiconductor device 105—is transmitted—as is illustrated in FIG. 2—via a test line 108*e* to the next semiconductor device in the above-mentioned JTAG daisy chain (here: to the JTAG data input pin of the fourth semiconductor device 104*c* that is in the bypass mode).

The signal received by the fourth semiconductor device 104*c* via the test line 108*e* at the JTAG data input pin is output—unmodified, but delayed by one clock—at the JTAG data output pin of the fourth semiconductor device 104*c*, and—as is illustrated in FIG. 2 and shortly indicated above—transmitted via the test line 108*a* to the above-mentioned JTAG test/proprietary test interface device 106, and from there—as test data output signal (TDO=Test Data Out)—via the test line 107*e* to the JTAG test device 102.

In the above-mentioned "FEED-THROUGH" mode, the electronic system 103 thus behaves—considered in total, or from the view of the test device 102, respectively—correspondingly identical to conventional JTAG systems. Considered from the view of the test device 102, the JTAG test/proprietary test interface device 106 is not at all present in the electronic system 103 in the "FEED-THROUGH" mode (but merely the above-mentioned semiconductor devices 104*a*, 104*b*, 105, 104*c*).

To bring the JTAG test/proprietary test interface device 106 (and thus the electronic system 103 as a whole) from the above-mentioned "FEED-THROUGH" mode to the above-mentioned "ISOLATE" mode, or back from the "ISOLATE" mode to the "FEED-THROUGH" mode, respectively, the test device 102 sends corresponding JTAG control signals to the JTAG test/proprietary test interface device 106 (e.g. via the lines 107*a* and/or 107*b*—JTAG control signals complying with the above-mentioned IEEE standard-"1149" or "1149.1"), and this way a JTAG register ("ISOLATE-/FEED-THROUGH mode select register") provided in the JTAG test/proprietary test interface device 106 is accessed, or corresponding data indicating the "ISOLATE" mode (or, vice versa, the "FEED-THROUGH" mode) are written therein, respectively.

The above-mentioned ISOLATE-/FEED-THROUGH mode select register provided on the JTAG test/proprietary test interface device 106 is addressed by the test device 102 as if it were present on the above-mentioned semiconductor device 105 (i.e. as if the semiconductor device 105 were addressed and not the JTAG test/proprietary test interface device 106).

In other words, the above-mentioned ISOLATE-/FEED-THROUGH mode indicate JTAG register corresponds to a JTAG register that has been displaced from the semiconductor device 105 to the JTAG test/proprietary test interface device 106 (and that is logically assigned to the semiconductor device 105). A part of functions that are otherwise provided by a JTAG test module of a semiconductor device (here: the semiconductor device 105) is taken over by a JTAG test (partial) module provided on the JTAG test/proprietary test interface device 106.

In the above-mentioned "ISOLATE" mode, the above-mentioned JTAG daisy chain is terminated by the JTAG test/proprietary test interface device 106. The test device 102 merely "sees" the JTAG test/proprietary test interface device 106, not, however, the remaining semiconductor devices 104a, 104b, 104c, 105.

Considered from the view of the test device 102, the JTAG test/proprietary test interface device 106 then assumes the place of a device to be tested via JTAG (here: the place of the semiconductor device 105).

To perform corresponding test methods in the "ISOLATE" mode, one or several further JTAG registers may be provided in the above-mentioned JTAG test/proprietary test interface device 106 in addition to the above-mentioned ISOLATE-/FEED-THROUGH mode select register, e.g. a "HIGH SPEED DRIVE/CAPTURE" mode select register, an "ADDITIONAL PIN ACCESS" mode select register, a "SSCM" mode select register, etc.

To bring the JTAG test/proprietary test interface device 106 (and thus the electronic system 103 as a whole) in the above-mentioned "ISOLATE" mode to the "ADDITIONAL PIN ACCESS" sub-mode, the test device 102 sends corresponding JTAG control signals to the JTAG test/proprietary test interface device 106 (e.g. via the lines 107a and/or 107b—JTAG control signals complying with the above-mentioned IEEE standard "1149" or "1149.1"), and this way the above-mentioned "ADDITIONAL PIN ACCESS" mode select register is accessed, or corresponding data—indicating the "ADDITIONAL PIN ACCESS" sub-mode—are written therein (or data with which one of a plurality of different "ADDITIONAL PIN ACCESS" sub-modes can be selected).

The above-mentioned "ADDITIONAL PIN ACCESS" mode select register provided on the JTAG test/proprietary test interface device 106 is addressed by the test device 102 as if it were present on the above-mentioned semiconductor device 105 (i.e. as if the semiconductor device 105 were addressed and not the JTAG test/proprietary test interface device 106). In other words, the above-mentioned "ADDITIONAL PIN ACCESS" mode select register thus corresponds to a JTAG register that has been displaced from the semiconductor device 105 to the JTAG test/proprietary test interface device 106 (and that is logically assigned to the semiconductor device 105).

As results from FIG. 2, the semiconductor device 105 may—in addition to the test lines 108d, 108e, 108f—also be connected to one or several further test lines 109, e.g. via an appropriate edge or pin connector (by means of which one or several additional pins of the semiconductor device 105 can be connected to the additional test lines 109), or e.g. via a contact needle adapter (by means of which one or several additional pads of the semiconductor device 105 can—directly—be contacted by corresponding contact needles and thus be connected to the additional test lines 109).

The test lines 109 may, for instance, be designed in the form of corresponding conductor paths running in or at the surface of the printed circuit board 103, or e.g. in the form of flexible wires running above or below the printed circuit board 103, etc.

As results from FIG. 2, the additional test lines are connected with the JTAG test/proprietary test interface device 106. On the side of the semiconductor device 105, the additional test lines 109 may—via the above-mentioned pins or pads—be connected with the above-mentioned proprietary, manufacturer-specific, non-standardized test module.

In the "ADDITIONAL PIN ACCESS" sub-mode of the "ISOLATE" mode, corresponding signals TCK (TCK=Test Clock), TMS (TMS=Test Mode Select), TDI (TDI=Test Data In), and—optionally—TRST (TRST=Test Reset) corresponding to the JTAG standard and sent by the test device 102 via the test lines 107a, 107b, 107c, 107d to the JTAG test/proprietary test interface device 106 can, by the JTAG test/proprietary test interface device 106, be converted to corresponding signals that do not or not necessarily correspond to the JTAG standard, and be transmitted, via one or a plurality of the additional test lines 109, and/or one or a plurality of the test lines 108f, and/or the test line 108b (interconnecting the semiconductor devices 104a, 104b) to the semiconductor device 105 that is to be subject to a corresponding proprietary, manufacturer-specific, non-standardized test.

The signals necessary for performing the corresponding proprietary, manufacturer-specific, non-standardized test—e.g. selected by the respective "ADDITIONAL PIN ACCESS" sub mode—are generated by the JTAG test/proprietary test interface device 106 in reaction to the JTAG signals TCK, TMS, TDI, and—optionally—TRST received from the test device 102 (by corresponding signal drive means (drive circuits) provided on the JTAG test/proprietary test interface device 106, and controlled by a control means provided on the JTAG test/proprietary test interface device 106).

These signals—that do not or not necessarily correspond to the JTAG standard—are transmitted via one or a plurality of the additional test lines 109, and/or one or a plurality of the test lines 108f, and/or the test line 108b to the semiconductor device 105, and the latter is this way subject to the corresponding proprietary, manufacturer-specific, non-standardized test.

The (test result) signals generated in reaction to the test in the semiconductor device 105—which do not or not necessarily correspond to the JTAG standard, either—are transmitted via one or a plurality of the additional test lines 109, and/or the above-mentioned test line 108a, and/or one or a plurality of the test lines 108f to the JTAG test/proprietary test interface device 106 (such as to specific signal receipt means (sample circuits) provided there).

The (test result) signals received by the JTAG test/proprietary test interface device 106 are converted by same (such as by the above-mentioned control means) to a corresponding (test result) data output signal TDO (TDO=Test Data Out) complying with the JTAG standard (e.g. by buffering in a further JTAG register provided on the JTAG test/proprietary test interface device 106 and adapted to be addressed by the test device 102), and are transmitted to the test device 102 via the test line 107e.

As has already been indicated above, the JTAG test/proprietary test interface device 106 can, in the above-mentioned "ISOLATE" mode, also be brought to a "HIGH SPEED DRIVE/CAPTURE" sub-mode (e.g. in that, correspondingly similar as described above for the "ADDITIONAL PIN ACCESS" sub-mode, the above-mentioned "HIGH SPEED DRIVE/CAPTURE" mode select register can be accessed by the test device 102, or corresponding data—indicating the "HIGH SPEED DRIVE/CAPTURE" sub-mode—can be written into it).

In the "HIGH SPEED DRIVE/CAPTURE" sub-mode, the signals necessary for performing a corresponding high speed test are generated by the JTAG test/proprietary test interface device 106 in reaction to JTAG signals TCK, TMS, TDI, and—optionally—TRST received from the test device 102 and corresponding to the JTAG standard (again by the signal drive means (drive circuits) provided on the JTAG test/proprietary test interface device 106, and controlled by the above-mentioned control means provided on the JTAG test/proprietary test interface device 106).

These may, apart from the data, and/or clock rate, and/or the corresponding signal durations, correspond to the JTAG standard and be transmitted to the semiconductor device 105 via the test lines 108*f*, and/or the test line 108*b* (and the test lines 108*c*, 108*d*, i.e. by interconnection of the devices 104*a*, 104*b*) for performing the corresponding high speed test. Alternatively, the signals generated by the JTAG test/proprietary test interface device 106 may also deviate from the JTAG standard in one or several further aspects and be transmitted to the semiconductor device 105 for performing a corresponding proprietary, manufacturer-specific, non-standardized test (e.g. via the additional test lines 109, and/or one or a plurality of the test lines 108*f*, and/or the test line 108*b*).

The (test result) signals generated in reaction to the test in the semiconductor device 105—which do not or not necessarily correspond to the JTAG standard, either (such as with respect to data rate, and/or clock rate, and/or signal duration, etc.)—are transmitted to the JTAG test/proprietary test interface device 106 via one or a plurality of the additional test lines 109, and/or the above-mentioned test line 108*a*, and/or one or a plurality of the test lines 108*f*.

The (test result) signals received by the JTAG test/proprietary test interface device 106 are converted by same (such as by the above-mentioned control means) to a corresponding (test result) data output signal TDO (TDO=Test Data Out) complying with the JTAG standard (e.g. by buffering in a further JTAG register provided on the JTAG test/proprietary test interface device 106 and adapted to be addressed by the test device 102), and are transmitted to the test device 102 via the test line 107*e*.

As has already been indicated above, the JTAG test/proprietary test interface device 106 can, in the above-mentioned "ISOLATE" mode, also be brought to a "SSCM" sub-mode (e.g. in that, correspondingly similar as described above for the "ADDITIONAL PIN ACCESS" sub-mode, the test device 102 accesses the above-mentioned "SSCM" mode select register, or in that corresponding data indicating the "SSCM" sub-mode are written into it).

In the "SSCM" sub-mode, the signals necessary for performing a corresponding SSCM test (SSCM="Single Scan Chain Mode") are generated by the JTAG test/proprietary test interface device 106 in reaction to JTAG signals TCK, TMS, TDI, and—optionally—TRST received from the test device 102 and corresponding to the JTAG standard (again by the signal drive means (drive circuits) provided on the JTAG test/proprietary test interface device 106, and controlled by the above-mentioned control means provided on the JTAG test/proprietary test interface device 106).

These may—correspondingly similar as described above for the "ADDITIONAL PIN ACCESS" sub-mode—be transmitted to a first additional SSCM pin (SSCM test data input pin) of the semiconductor device 105 via a first one of the additional test lines 109.

In reaction to the signals received at the first SSCM pin, a SSCM test of the elements, such as memory elements, e.g. flip-flops, provided on the semiconductor device 105 is performed.

The (test result) signals generated in reaction to the SSCM test in the semiconductor device 105 (which reflect corresponding test result data stored in a shift register of the semiconductor device 105) are output at a second additional SSCM pin of the semiconductor device 105 and transmitted to the JTAG test/proprietary test interface device 106 via a second one of the additional test lines 109.

The (test result) signals received from the JTAG test/proprietary test interface device 106 are buffered by same (such as by the above-mentioned control means) in a corresponding further JTAG register provided on the JTAG test/proprietary test interface device 106, and then—corresponding to the register content—a corresponding (test result) data output signal TDO (TDO=Test Data Out) complying with the JTAG standard is transmitted to the test device 102 via the test line 107*e*.

The SSCM scan chain or the test result data of the above-mentioned shift register provided on the semiconductor device 105 are thus mapped into the further JTAG register provided on the JTAG test/proprietary test interface device 106. This JTAG register is addressed by the test device 102 as if it were present on the above-mentioned semiconductor device 105 (i.e. as if the semiconductor device 105 were addressed and not the JTAG test/proprietary test interface device 106).

Thus, a corresponding SSCM test can be performed on the semiconductor device 105 by the test device 101 by making use of sequences that (exclusively) correspond to the JTAG standard and that are transmitted via the test lines 107*a*, 107*b*, 107*c*, 107*d*, 107*e*.

The above-described concept that is provided in the instant embodiment, namely that JTAG registers that are logically assigned to the semiconductor device 105 are physically arranged on the JTAG test/proprietary test interface device 106 enables a "displacement" of JTAG registers—that are logically assigned to the semiconductor device 105—to the JTAG test/proprietary test interface device 106 with new module versions of the semiconductor device 105 (and/or a "relocation" of one or a plurality of JTAG registers from the JTAG test/proprietary test interface device 106 to the semiconductor device 105 with new module versions of the semiconductor device 105) without the test program provided on the test device 102 having to be modified.

In the instant embodiment, the JTAG test/proprietary test interface device 106 is not at all provided (or does not appear, respectively) in the programming and data management of the test device 102 (or of the (test) program stored thereon, respectively), or in the corresponding JTAG topology of the JTAG test/proprietary test interface device 106, respectively (but merely e.g. the semiconductor devices 104*a*, 104*b*, 104*c*, 105)—for the test device 102 the JTAG test/proprietary test interface device 106 is not existent. For the programming and data management of the test device 102, corresponding, standardized, public, system-independent files written in BDSL (BDSL=Boundary Scan Description Language) are used, which are provided by the respective device manufacturer, and which define the devices used in the respective JTAG topology, such as their addressing (in the programming and data management of the test device 102: merely for the semiconductor devices 104*a*, 104*b*, 104*c*, 105, not, however, for the JTAG test/proprietary test interface device 106—which is, as explained above—addressed as if the semiconductor device 105 were accessed).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor test method, comprising:
in a first mode of a first semiconductor chip, in reaction to test signals corresponding to a test standard and received by the first semiconductor chip from a test device, the first semiconductor chip outputting first test output signals via at least one signal line to a second semiconductor chip to be tested, the first and the second semiconductor chips being separate physical entities, wherein the outputted first test output signals correspond to the test standard; and
in a second mode of said first semiconductor chip, in reaction to test signals corresponding to the test standard and received by said first semiconductor chip from a test device, the first semiconductor chip outputting second test output signals that do not correspond to the test standard to the second semiconductor chip to be tested via the at least one signal line.

2. The method of claim 1, further comprising providing a register corresponding to the test standard on the first semiconductor chip, said register being addressed by said test device as if the register were provided on the second semiconductor chip to be tested.

3. The method of claim 2, wherein the register is a JTAG IEEE standard 1149.1-1990 register.

4. The method of claim 2, further comprising physically providing the register on the first semiconductor chip and logically assigning the register to said second semiconductor chip to be tested.

5. The method of claim 1, wherein the test standard is a JTAG IEEE standard 1149.1-1990.

6. The method of claim 1, wherein the test signals received from the first semiconductor chip comprise JTAG test signals.

7. The method of claim 1, wherein the second test output signals output by the first semiconductor chip in the second mode do not correspond to the test standard with respect to data rate, or clock rate, or signal duration.

8. The method of claim 1, further comprising transmitting the signals output by the first semiconductor chip in the first mode via JTAG IEEE standard 1149.1-1990 signal lines from the first semiconductor chip to said second semiconductor chip to be tested.

9. The method of claim 8, further comprising transmitting the second test output signals output by the first semiconductor chip in the second mode from the first semiconductor chip to said second semiconductor chip to be tested via one or a plurality of lines that are provided in addition to the JTAG IEEE standard 1149.1-1990 signal lines.

10. The method of claim 8, further comprising transmitting the second test output signals output by the first semiconductor chip in the second mode from the first semiconductor chip to said second semiconductor chip to be tested via said JTAG IEEE standard 1149.1-1990 signal lines.

11. An interface device comprising:
a test device configured to generate test signals; and
a first semiconductor device configured to receive the test signals from the test device;
wherein in a first mode, in reaction to the test signals received from the test device and corresponding to a test standard, first test output signals corresponding to the test standard are output to a second semiconductor device to be tested via at least one signal line, the first and the second semiconductor devices being physically separate;
wherein the outputted first test output signals correspond to the test standard; and
wherein in a second mode, in reaction to test signals received from the test device and corresponding to the test standard, second test output signals that do not correspond to the test standard are output to the second semiconductor device to be tested via the at least one signal line.

12. A semiconductor device test system comprising:
at least one semiconductor device to be tested; and
a semiconductor chip by which, in a first mode, in reaction to test signals corresponding to a test standard and received from a test device, first test output signals corresponding to the test standard are output via at least one signal line to the semiconductor device to be tested, and by which, in a second mode, in reaction to test signals corresponding to the test standard and received from a test device, second test output signals that do not correspond to the test standard are output to the semiconductor device to be tested via the at least one signal line, wherein the test device and semiconductor device are physically separate devices.

13. The test system of claim 12, wherein a register corresponding to the test standard is provided on the semiconductor chip, said register being designed and equipped such that it is adapted to be addressed by said test device as if the register were provided on said semiconductor device to be tested.

14. A semiconductor device test system comprising:
a semiconductor device to be tested corresponding to a test standard;
a semiconductor chip;
means for outputting signals corresponding to the test standard to the semiconductor device to be tested as first test output signals via at least one signal line when in a first mode and in reaction to test signals corresponding to a test standard received from the test device, wherein the outputted first test output signals correspond to the test standard; and
means for outputting signals that do not correspond to the test standard to the semiconductor device to be tested as second test output signals via the at least one signal line when in a second mode and in reaction to test signals corresponding to the test standard received from the test device, wherein semiconductor device and the semiconductor chip are physically separate devices.

15. The test system of claim 14, further comprising a register corresponding to the test standard on the semiconductor chip, wherein the register is addressed by the test device as if the register were provided on the semiconductor device to be tested.

16. The test system of claim 15, wherein the register is a JTAG IEEE standard 1149.1-1990 register.

17. The test system of claim 14, wherein the test standard is a JTAG IEEE standard 1149.1-1990.